United States Patent
Chu et al.

(10) Patent No.: US 10,658,241 B2
(45) Date of Patent: May 19, 2020

(54) METHOD OF FABRICATING INTEGRATED CIRCUIT

(71) Applicant: UNITED MICROELECTRONICS CORP., Hsin-Chu (TW)

(72) Inventors: Chung-Liang Chu, Kaohsiung (TW); Yu-Ruei Chen, New Taipei (TW); Yu-Hsiang Lin, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 290 days.

(21) Appl. No.: 15/839,769

(22) Filed: Dec. 12, 2017

(65) Prior Publication Data

US 2019/0181046 A1    Jun. 13, 2019

(51) Int. Cl.
| | |
|---|---|
| *H01L 21/82* | (2006.01) |
| *H01L 27/02* | (2006.01) |
| *H01L 27/088* | (2006.01) |
| *H01L 23/522* | (2006.01) |
| *H01L 23/528* | (2006.01) |
| *H01L 23/50* | (2006.01) |
| *H01L 27/092* | (2006.01) |
| *H01L 29/78* | (2006.01) |

(52) U.S. Cl.
CPC .............. *H01L 21/82* (2013.01); *H01L 23/50* (2013.01); *H01L 23/528* (2013.01); *H01L 23/5226* (2013.01); *H01L 27/0207* (2013.01); *H01L 27/0886* (2013.01); *H01L 27/0924* (2013.01); *H01L 29/785* (2013.01)

(58) Field of Classification Search
CPC ..... H01L 21/82; H01L 23/50; H01L 23/5226; H01L 23/528; H01L 27/0207; H01L 27/0886; H01L 27/0924
See application file for complete search history.

(56) References Cited

U.S. PATENT DOCUMENTS

| | | | | |
|---|---|---|---|---|
| 6,099,992 | A * | 8/2000 | Motoyama | H01L 21/32136 257/E21.311 |
| 6,553,274 | B1 * | 4/2003 | Motoyama | H01L 21/32136 257/E21.311 |
| 6,864,106 | B1 * | 3/2005 | Wang | G11C 29/50 438/14 |
| 7,754,395 | B2 * | 7/2010 | Stanton | G03F 1/50 430/394 |
| 7,932,003 | B2 * | 4/2011 | Stanton | G03F 1/50 430/394 |
| 8,952,529 | B2 * | 2/2015 | Lee | H01L 23/49838 257/734 |
| 9,196,352 | B2 | 11/2015 | Hung | |
| 9,379,119 | B1 | 6/2016 | Huang | |
| 9,589,966 | B2 | 3/2017 | Hsu | |

(Continued)

*Primary Examiner* — Minh N Trinh
(74) *Attorney, Agent, or Firm* — Winston Hsu

(57) ABSTRACT

A method of fabricating an integrated circuit includes the following steps. A first reticle is used to form a first pattern, wherein the first pattern includes a first feature and a first jog part protruding from and orthogonal to the first feature. A second reticle is used to form a second pattern, wherein the second pattern includes a second feature, and the first feature is between the second feature and the first jog part. A third reticle is used to form a third pattern, wherein the third pattern includes a third-one feature overlapping the first jog part and a third-two feature overlapping the second feature.

15 Claims, 4 Drawing Sheets

(56) References Cited

U.S. PATENT DOCUMENTS

2005/0030513 A1\* 2/2005 Farrar .................... B82Y 10/00
355/77
2019/0181046 A1\* 6/2019 Chu ........................ H01L 21/82

\* cited by examiner

METHOD OF FABRICATING INTEGRATED CIRCUIT

BACKGROUND OF THE INVENTION

1. Field of the Invention

The present invention relates generally to a method of fabricating an integrated circuit, and more specifically to a method of fabricating an integrated circuit applying jogs.

2. Description of the Prior Art

An integrated circuit (IC) is a device, such as a semiconductor device or an electronic system that includes many electronic components, such as transistors, resistors and diodes. These components are often interconnected to form multiple circuit components, e.g. gates, cells, memory units, arithmetic units, controllers and decoders. An IC includes multiple layers of wiring that interconnects the electronic and circuit components. Design engineers design ICs by transforming logical or circuit descriptions of the components into geometric descriptions, which are called design layouts.

Fabrication foundries (fabs) manufacture ICs based on the design layouts using a photolithographic process. Photolithography is an optical printing and fabrication process by which patterns on a photolithographic mask (i.e. a photomask) are imaged and defined onto a photosensitive layer coating a substrate. To fabricate an IC, photomasks are created using the IC design layout as a template. The photomasks contain the various geometries (features) of the IC design layout. The various geometries contained on the photomasks correspond to the various base physical IC elements that comprise functional circuit components such as transistors, interconnect wiring and via pads, as well as other elements that are not functional circuit elements, but are used to facilitate, enhance or track various manufacturing processes. Through sequential use of the various photomasks corresponding to a given IC in an IC fabrication process, a large number of material layers of various shapes and thicknesses with different conductive and insulating properties may be built up to form the overall IC and the circuits within the IC design layout.

Constraining factors in traditional photolithographic processes limit their effectiveness as circuit complexity continues to increase and transistor designs become more advanced and ever smaller in size. Some constraining factors are the lights/optics used within the photolithographic processing systems. Specifically, the lights/optics are band limited due to physical limitations (e.g. wavelength and aperture) of the photolithographic process. The photolithographic process therefore cannot print beyond a certain pitch and distance, and also suffers from other physical manufacturing constraints.

A pitch specifies a sum of the width of a feature and the space on a side of the feature separating it from a neighboring feature. Depending on the photolithographic process, factors such as optics and wavelengths of light or radiation restrict how small the pitch may be made before features can no longer be reliably printed to a wafer or mask. The smallest size of any feature that can be created on a wafer is severely limited by the pitch.

With the advance of ultra-deep submicron technology, the feature size and feature pitch become so small that existing lithography processes meet a bottleneck in printing the shapes represented by the features. There are also difficulties in the practical use of advanced photolithographic processes, such as extreme ultra violet (EUV). Current lithography technology is expected to be used for next generation silicon technology. To compensate for the difficulty in printing the shape of small pitches, multiple patterning lithography is recognized as a promising solution for 32 nm, 22 nm and sub-22 nm volume IC production. Multiple patterning lithography technology decomposes a single layer of a layout into multiple masks and applies multiple exposures to print the shapes in the layer. The decomposition provided by multiple patterning lithography increases shape printing pitch and improves the focus depth.

SUMMARY OF THE INVENTION

The present invention provides a method of fabricating an integrated circuit, which applies jogs to enlarge the distances of adjacent features, thereby enabling these features to be formed by one single exposure rather than double or multiple patterning processes.

The present invention provides a method of fabricating an integrated circuit including the following steps. A first reticle is used to form a first pattern, wherein the first pattern includes a first feature and a first jog part protruding from and orthogonal to the first feature. A second reticle is used to form a second pattern, wherein the second pattern includes a second feature, and the first feature is between the second feature and the first jog part. A third reticle is used to form a third pattern, wherein the third pattern includes a third-one feature overlapping the first jog part and a third-two feature overlapping the second feature.

According to the above, the present invention provides a method of fabricating an integrated circuit, which uses a first reticle to form a first pattern including a first feature and a first jog part protruding from and orthogonal to the first feature, uses a second reticle to form a second pattern including a second feature, uses a third reticle to form a third pattern including a third-one feature overlapping the first jog part and a third-two feature overlapping the second feature. By disposing the first jog part and the second feature at opposite sides of the first feature, the distance between the third-one feature overlapping the first jog part and the third-two feature overlapping the second feature can be larger than the distance between the third-one feature overlapping the first feature and the third-two feature overlapping the second feature. That is, the distance between the third-one feature and the third-two feature is enlarged, and is large enough for the third-one feature and the third-two feature to be printed by one single exposure process of one single reticle instead of printing the third-one feature and the third-two feature respectively by doubling patterning technology. This reduces exposure processes, saves reticles, and simplifies the processing steps.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
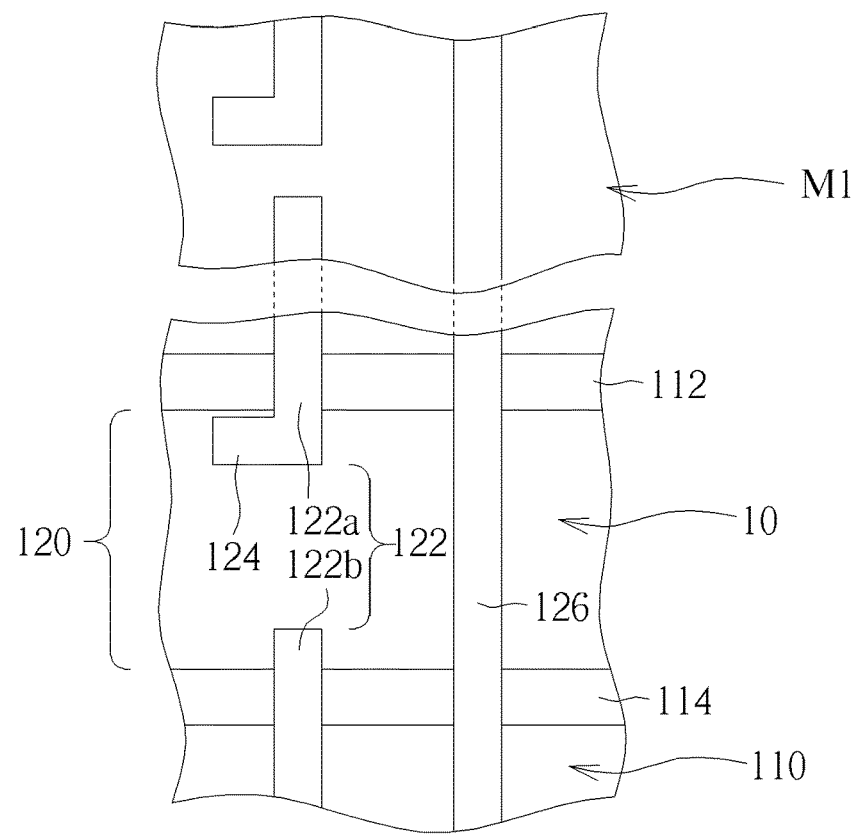
FIG. 1 schematically depicts a top view of a method of fabricating an integrated circuit according to an embodiment of the present invention.

FIG. 1 schematically depicts a top view of a method of fabricating an integrated circuit according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. The substrate 110 may include a first active area 112 and a second active area 114, wherein the first active area 112 is parallel to the second active area 114, but is not limited thereto. The number of the first active area 112 or the second active area 114 may be more than one. The first active area 112 and the second active area 114 are isolated from each other by an isolation structure 10. The isolation structure 10 may be a shallow trench isolation (STI) structure, which may be formed by a shallow trench isolation (STI) process, but is not limited thereto. Then, a first reticle M1 is applied to form a first pattern 120. In this embodiment, the first pattern 120 includes a first feature 122 and a first jog part 124, wherein the first jog part 124 preferably protrudes from and is orthogonal to the first feature 122, but is not limited thereto. In this case, the first feature 122 may include the first-one feature 122a and the first-two feature 122b, and the first-one feature 122a is separated from the first-two feature 122b, but is not restricted thereto. The first pattern 120 may further include other features such as a first-third feature 126, wherein the first feature 122 and the first-third feature 126 may both be line features which are parallel to each other, depending upon practical requirements.

Figure 2:
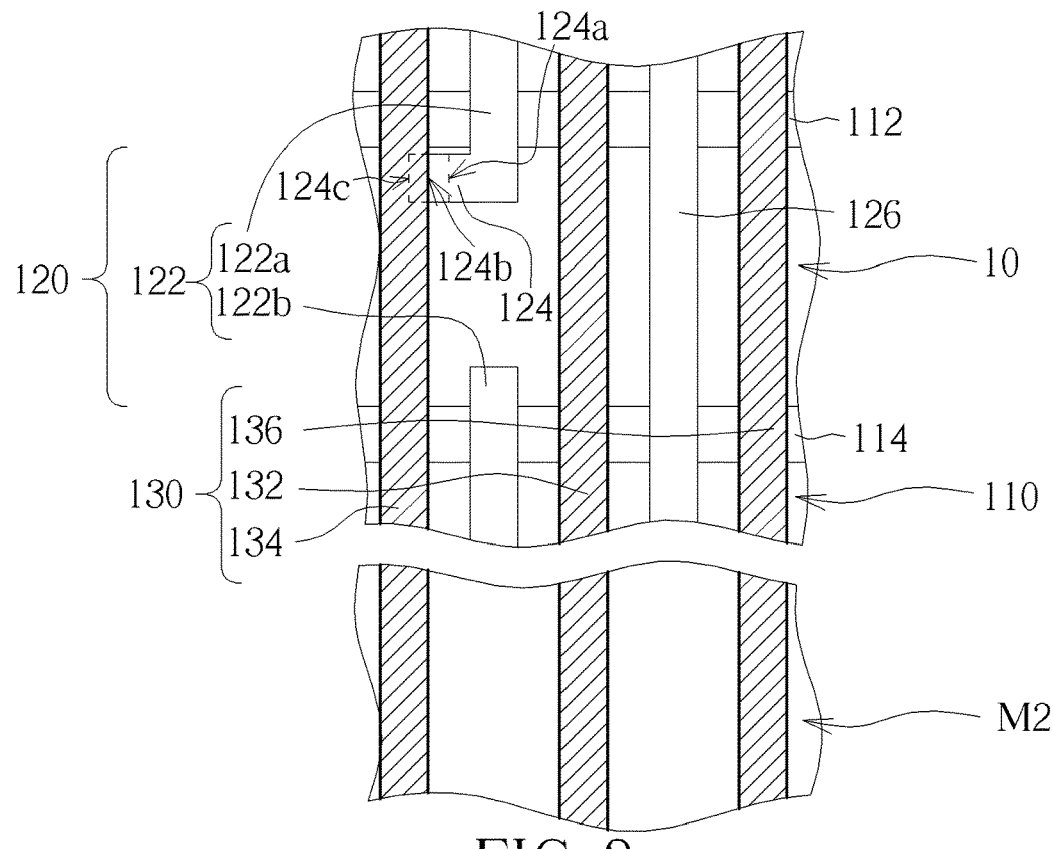
FIG. 2 schematically depicts a top view of a method of fabricating an integrated circuit according to an embodiment of the present invention.

As shown in FIG. 2, a second reticle M2 is applied to form a second pattern 130. In this embodiment, the second pattern 130 includes a second feature 132, wherein the first feature 122 is between the second feature 132 and the first jog part 124, thereby the distance between the second feature 132 and the first jog part 124 can be larger than the distance between the second feature 132 and the first feature 122. Features formed on the second feature 132 and the first jog part 124 in later processes can have larger distances from each other than features formed on the second feature 132 and the first feature 122. Hence, features formed on the second feature 132 and the first jog part 124 can be formed by one single exposure process applying one single reticle.

In this embodiment, the first pattern 120 and the second pattern 130 pass through the first active area 112 and the second active area 114, and the first pattern 120 and the second pattern 130 are arranged alternately, but this is not limited thereto. More precisely, the first feature 122 is a first line feature and the second feature 132 is a second line feature, wherein the second line feature is parallel to the first line feature. In this case, the substrate 110 is a wafer having multilayers formed thereon and the first pattern 120 and the second pattern 130 are formed in a same layer on the substrate 110, but this is not limited thereto. More precisely, the first pattern 120 may be a slot contact pattern while the second pattern is a gate pattern, wherein the gate pattern is particularly a gate pattern of a Fin field effect transistor (FinFET). In another embodiment, the first pattern 120 and the second pattern 130 may be formed in different layers.

Moreover, the second pattern 130 may further include a second-one feature 134, wherein the first feature 122 is between the second feature 132 and the second-one feature 134. In a first case, the first jog part 124a may have a distance from the second-one feature 134; in a second case, the first jog part 124b may trim the second-one feature 134; in a third case, the first jog part 124c may overlap the second-one feature 134, depending upon requirements. As the first pattern 120 is a slot contact pattern and the second pattern 130 is a gate pattern with top caps, the first jog part 124c can overlap the second-one feature 134 with the top caps electrically isolating the first jog part 124c from the second-one feature 134. Furthermore, the second pattern 130 may further include a second-two feature 136 parallel to the second feature 132 and the second-one feature 134, wherein the second feature 132, the second-one feature 134 and the second-two feature 136 may all have common distances, but this is not limited thereto.

Figure 3:
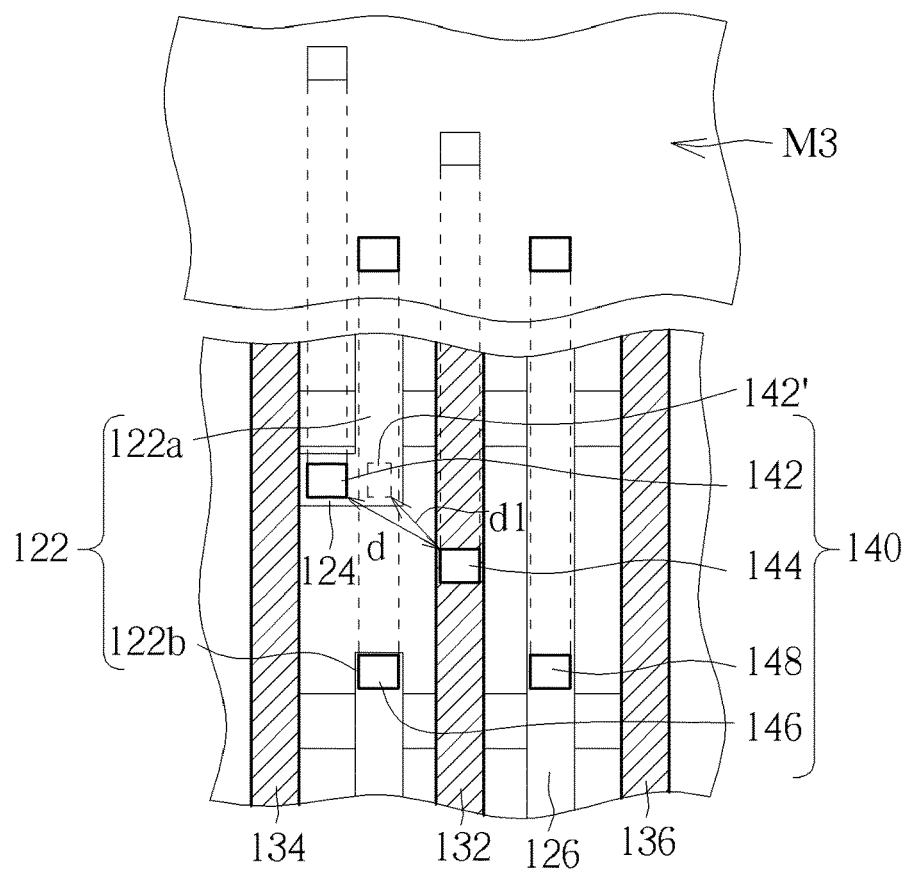
FIG. 3 schematically depicts a top view of a method of fabricating an integrated circuit according to an embodiment of the present invention.

As shown in FIG. 3, a third reticle M3 is applied to form a third pattern 140. In this embodiment, the third pattern 140 includes a third-one feature 142 overlapping the first jog part 124 and a third-two feature 144 overlapping the second feature 132. In this case, the third-one feature 142 overlaps the first jog part 124 instead of a third-one feature 142' overlapping the first feature 122 (that is, the third-one feature 142 of the current application is shifted from overlapping the first feature 122 to overlapping the first jog part 124), so that a distance d between the third-one feature 142 and the third-two feature 144 can be larger than a distance d1 between the third-one feature 142' and the third-two feature 144. Hence, the third-one feature 142 and the third-two feature 144 can be printed by one single exposure process of one single reticle (the third reticle M3) as the distance d1 between the third-one feature 142' and the third-two feature 144 is too short to be printed by one single exposure process and thus the third-one feature 142' and the third-two feature 144 must be printed by two exposure processes applying double patterning. The method of shifting the third-one feature 142 from overlapping the first feature 122 to overlapping the first jog part 124 can reduce exposure processes, save reticles, and simplify processing steps.

In this case, the third pattern 140 is formed in different layers from the first pattern 120 and the second pattern 130. For instance, the third pattern 140 is a via pattern while the first pattern 120 is a slot contact pattern and the second pattern 130 is a gate pattern, but is not limited thereto. The method of using jog parts to enlarge the distance of two adjacent features in order to print the two adjacent features by one single process can be applied in common layers or different layers.

Figure 4:
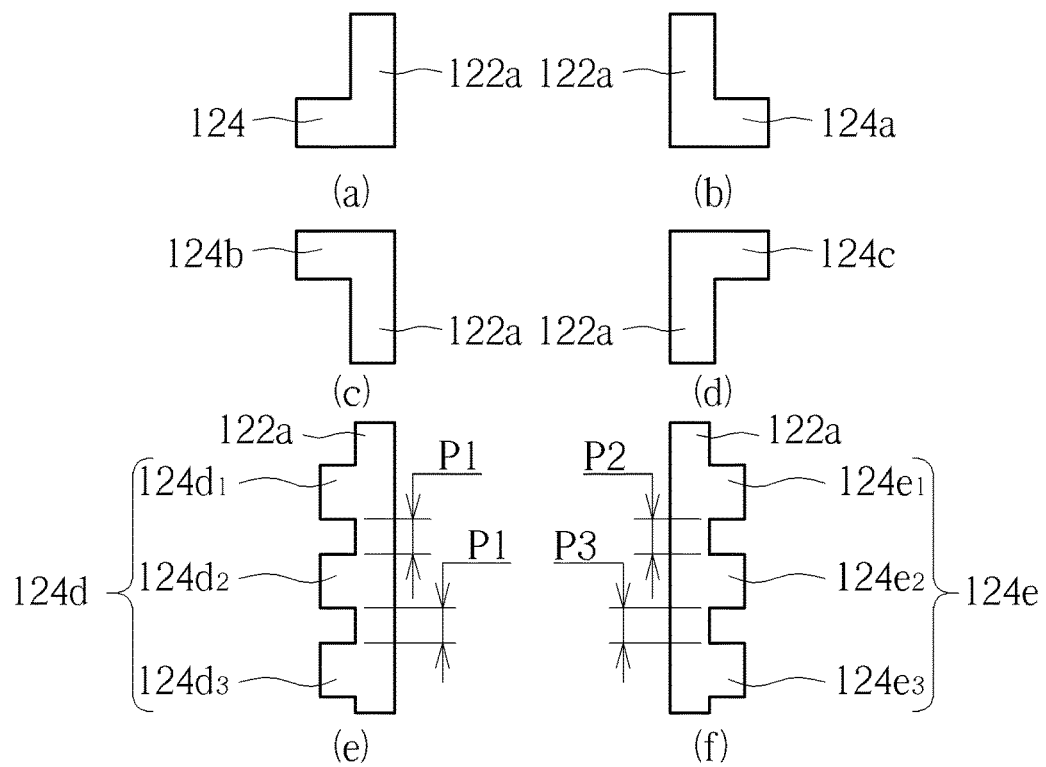
FIG. 4 schematically depicts top views of jog parts according to embodiments of the present invention.

Furthermore, the jog parts may be disposed in many ways. FIG. 4 schematically depicts top views of jog parts according to embodiments of the present invention. FIG. 4(a), FIG. 4(b), FIG. 4(c) and FIG. 4(d) depict one feature accompanied by one single jog. FIG. 4(a) depicts the first-one feature 122a and the first jog part 124 of FIG. 1, wherein the first jog part 124 is orthogonal to the first-one feature 122a, and the first jog part 124 is at the left side and the bottom of the first-one feature 122a. FIG. 4(b) depicts the first-one feature 122a and a first jog part 124a, wherein the first jog part 124a is orthogonal to the first-one feature 122a, and the first jog part 124 is at the right side and the bottom of the first-one feature 122a. FIG. 4(c) depicts the first-one feature 122a and a first jog part 124b, wherein the first jog part 124b is orthogonal to the first-one feature 122a, and the first jog part 124b is at the left side and the top of the first-one feature 122a. FIG. 4(d) depicts the first-one feature 122a and a first jog part 124c, wherein the first jog part 124c is orthogonal to the first-one feature 122a, and the first jog part 124c is at the right side and the top of the first-one feature 122a. Therefore, the first-one feature 122a and the first jog part 124/124a/124b/124c having one single jog constitute an L-shape.

FIG. 4(e) and FIG. 4(f) depict one feature accompanied by a plurality of jogs. FIG. 4(e) depicts the first-one feature 122a and the first jog part 124d having three jogs 124d1/124d2/124d3, wherein all of the jogs 124d1/124d2/124d3 are orthogonal to the first-one feature 122a, and all of the jogs 124d1/124d2/124d3 are at the left side of the first-one feature 122a. In this case, all of the jogs 124d1/124d2/124d3 have common pitches P1, but this is not limited thereto. FIG. 4(f) depicts the first-one feature 122a and a first jog part 124e having three jogs 124e1/124e2/124e3, wherein all of the jogs 124e1/124e2/124e3 are orthogonal to the first-one feature 122a, and all of the jogs 124e1/124e2/124e3 are at the right side of the first-one feature 122a. In this case, a pitch P2 of the jog 124e1 and the jog 124e2 is larger than a pitch P3 of the jog 124e2 and the jog 124e3, but this is not limited thereto. Therefore, the first-one feature 122a and the first jog part 124d/124e constitute T-shapes. The layouts of the jog parts depend upon requirements.

Figure 5:
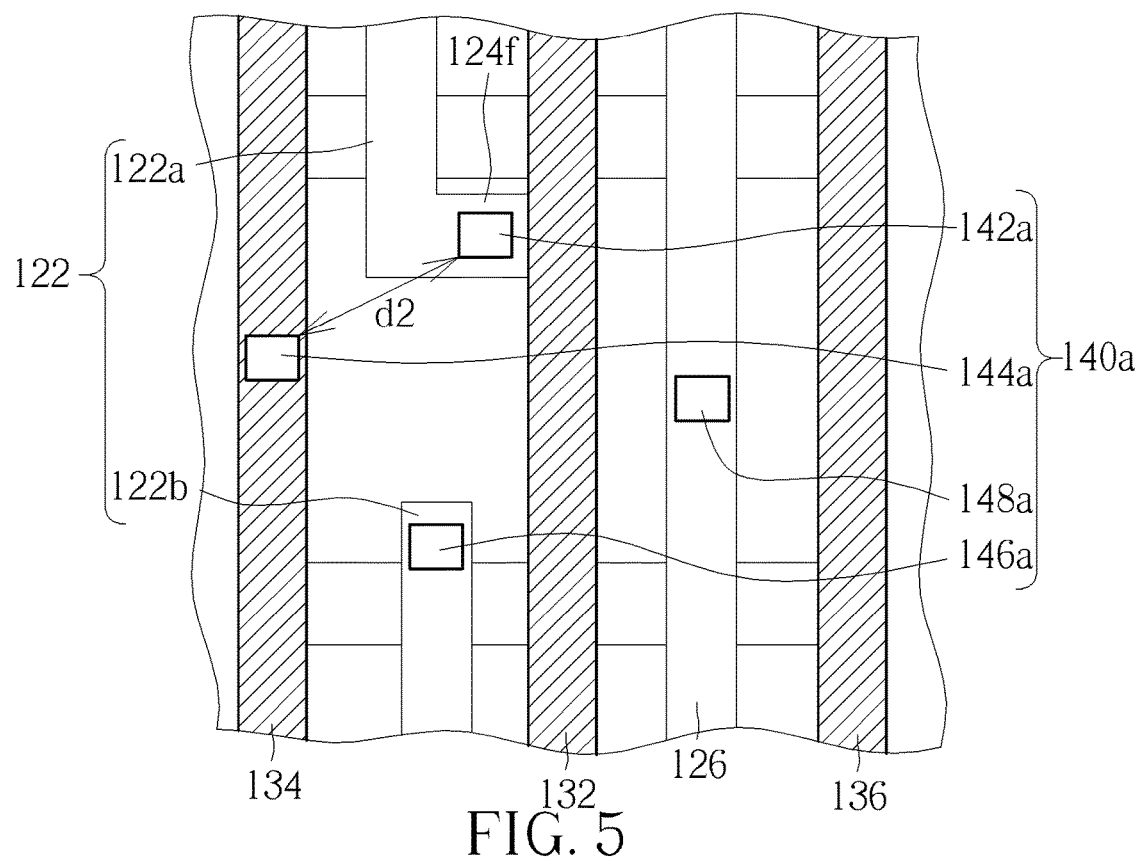
FIG. 5 schematically depicts a top view of an integrated circuit according to an embodiment of the present invention.
Figure 6:
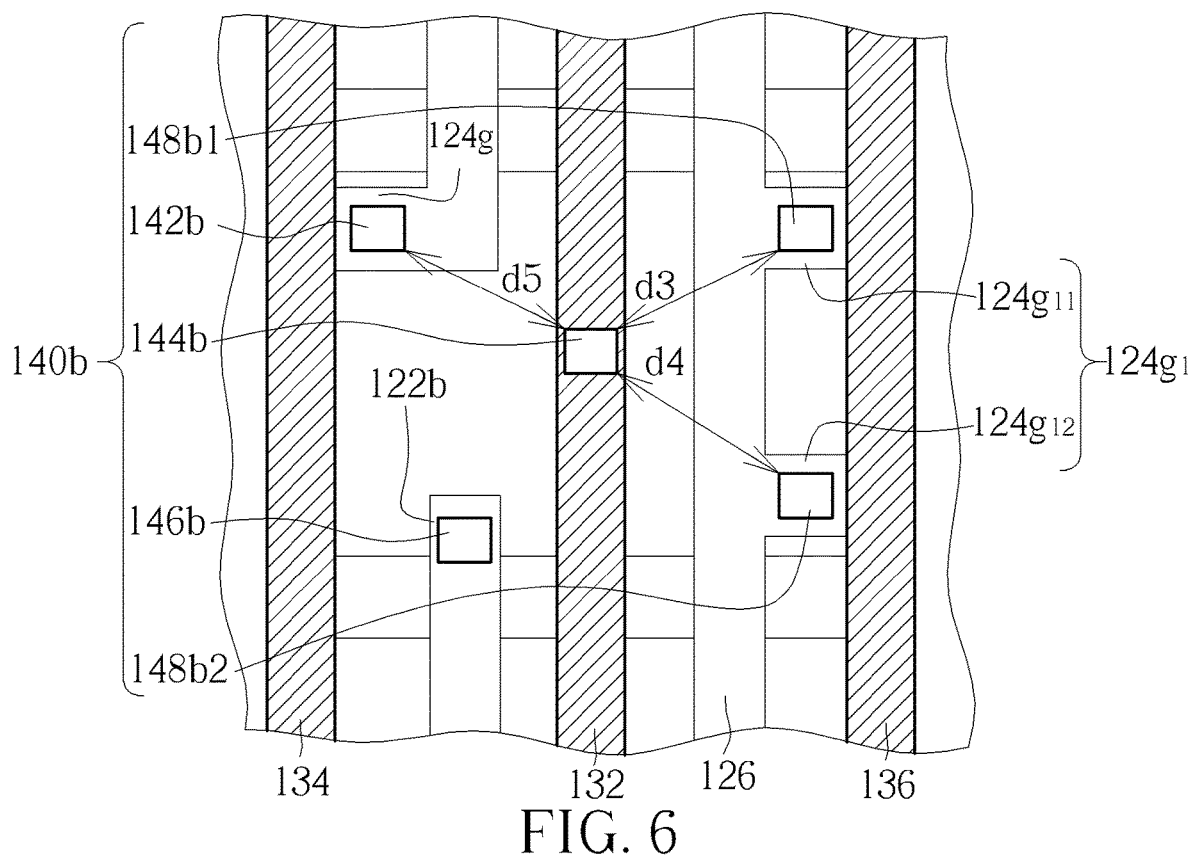
FIG. 6 schematically depicts a top view of an integrated circuit according to an embodiment of the present invention.
Figure 7:
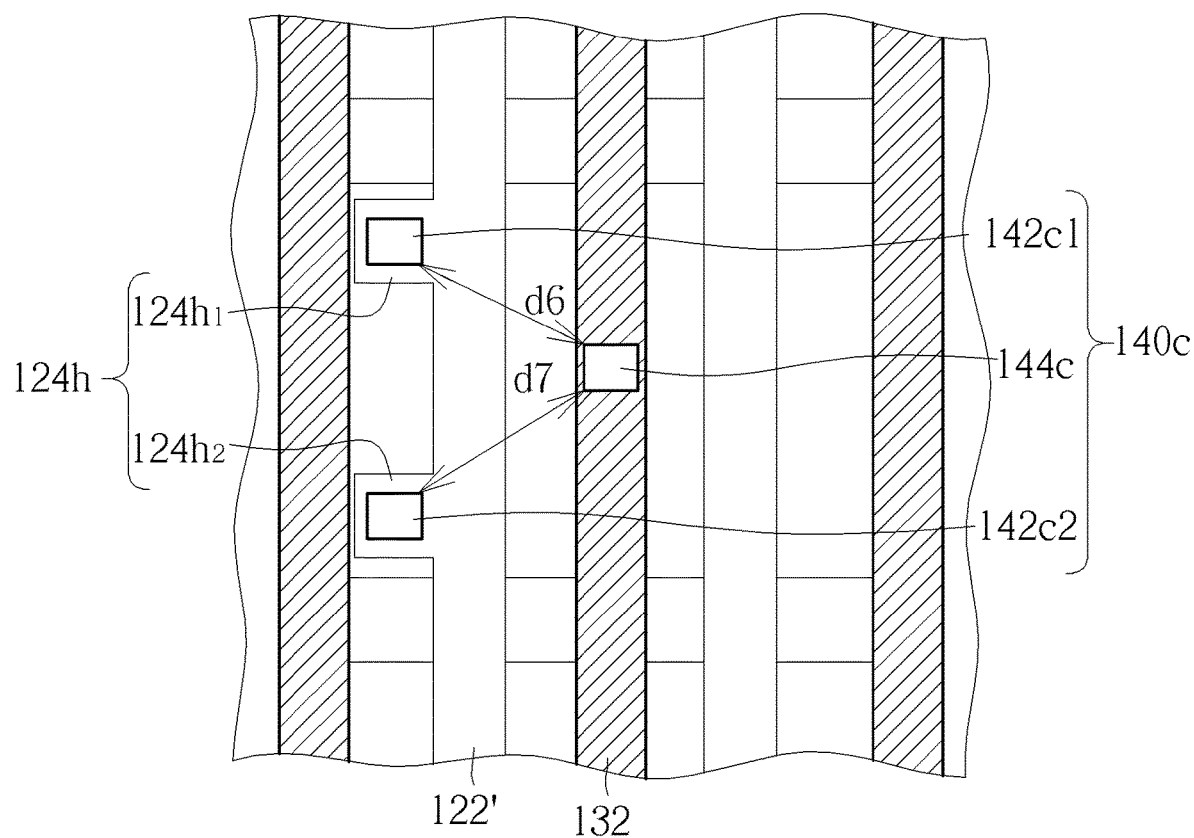
FIG. 7 schematically depicts a top view of an integrated circuit according to an embodiment of the present invention.

FIG. 3 depicts one top view of an integrated circuit applying the jog method of the present invention. FIGS. 5-7 depict other cases applying the jog method of the present invention. The first pattern 120 and the second pattern 130 of FIG. 3 are similar to those of FIGS. 5-7, and thus use the same symbols. Jog parts used in FIGS. 5-7 depend on third patterns 140a/140b/140c. That is, the jog parts are used to extend the distances of adjacent features of the third patterns 140a/140b/140c, and these adjacent features of each of the third patterns 140a/140b/140c can thus be formed by one single exposure process of one single reticle.

As shown in FIG. 5, a third pattern 140a includes a third-one feature 142a overlapping a first jog part 124f, a third-two feature 144a overlapping the second-one feature 134, a third-three feature 146a overlapping the first-two feature 122b, and a third-four feature 148a overlapping the first-third feature 126. Thus, a distance d2 of the third-one feature 142a and the third-two feature 144a is large enough for the third-one feature 142a and the third-two feature 144a to being printed by one single exposure process of one single reticle.

As shown in FIG. 6, a third pattern 140b includes a third-one feature 142b overlapping a first jog part 124g, a third-two feature 144b overlapping the second feature 132, a third-three feature 146b overlapping the first-two feature 122b, and a third-four feature 148b1 and a third-five feature 148b2 overlapping a second jog part 124g1. In this case, the second jog part 124g1 includes a first jog 124g11 and a second jog 124g12, and the third-four feature 148b1 overlaps the first jog 124g11 while the third-five feature 148b2 overlaps the second jog 124g12. Thus, a distance d3 of the third-four feature 148b1 and the third-two feature 144b, a distance d4 of the third-five feature 148b2 and the third-two feature 144b and a distance d5 of the third-one feature 142b and the third-two feature 144b are all large enough to be printed by one single exposure process of one single reticle.

As shown in FIG. 7, the first feature 122 of FIG. 3 is replaced by one single first line feature 122'. A first jog part 124h including a first jog 124h1 and a second jog 124h2 protrudes from the single first line feature 122', and the single first line feature 122' is between the first jog part 124h and the second feature 132. A third-one feature 142c1 overlaps the first jog 124h1, a third-one feature 142c2 overlaps the second jog 124h2, and a third-two feature 144c overlaps the second feature 132. Thereby, a distance d6 between the third-one feature 142c1 and the third-two feature 144c and a distance d7 between the third-one feature 142c2 and the third-two feature 144c are both large enough for the third-one feature 142c1, the third-one feature 142c2 and the third-two feature 144c to be printed by one single exposure process of one single reticle.

To summarize, the present invention provides a method of fabricating an integrated circuit, which uses a first reticle to form a first pattern including a first feature and a first jog part protruding from and orthogonal to the first feature, uses a second reticle to form a second pattern including a second feature, and uses a third reticle to form a third pattern including a third-one feature overlapping the first jog part and a third-two feature overlapping the second feature. By disposing the first jog part and the second feature at the opposite sides of the first feature, the distance between the third-one feature overlapping the first jog part and the third-two feature overlapping the second feature can be larger than the distance between the third-one feature overlapping the first feature and the third-two feature overlapping the second feature. The distance between the third-one feature and the third-two feature is enlarged, and is thereby large enough for the third-one feature and the third-two feature to be printed by one single exposure process of one single reticle instead of printing the third-one feature and the third-two feature respectively by doubling patterning technology. This reduces exposure processes, saves reticles, and simplifies the processing steps.

The first feature and the first jog part constitute an L-shape or a T-shape, etc. The first jog part may include a plurality of jogs. In one case, the second pattern includes a second-one feature, and the first feature is between the second feature and the second-one feature. The first jog part may be a distance from the second-one feature, trim the second-one feature, or overlap the second-one feature. As the first pattern is a slot contact pattern and the second pattern is a gate pattern with top caps, the first jog part can overlap the second-one feature with the top caps electrically isolating the first jog part from the second-one feature.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating an integrated circuit, comprising:
   providing a first reticle, a second reticle, a third reticle and a substrate;
   forming a first pattern on the substrate by using the first reticle, wherein the first pattern comprises a first feature and a first jog part protruding from and orthogonal to the first feature;
   forming a second pattern on the substrate by using the second reticle, wherein the second pattern comprises a second feature, and the first feature is between the second feature and the first jog part; and forming a third pattern on the substrate by using the third reticle, wherein the third pattern comprises a third-one feature overlapping the first jog part and a third-two feature overlapping the second feature.

2. The method of fabricating an integrated circuit according to claim 1, wherein the first feature comprises a first line feature and the second feature comprises a second line feature.

3. The method of fabricating an integrated circuit according to claim 2, wherein the second line feature is parallel to the first line feature.

4. The method of fabricating an integrated circuit according to claim 1, wherein the first pattern and the second pattern are formed in a same layer.

5. The method of fabricating an integrated circuit according to claim 1, wherein the first pattern and the second pattern are arranged alternately.

6. The method of fabricating an integrated circuit according to claim 1, wherein the third pattern is formed in different layers from the first pattern and the second pattern.

7. The method of fabricating an integrated circuit according to claim 1, wherein the third pattern is a via pattern while the first pattern is a slot contact pattern and the second pattern is a gate pattern.

8. The method of fabricating an integrated circuit according to claim 7, wherein the gate pattern is a gate pattern of a FinFET.

9. The method of fabricating an integrated circuit according to claim 1, wherein the second pattern comprises a second-one feature and the first feature is between the second feature and the second-one feature.

10. The method of fabricating an integrated circuit according to claim 9, wherein the first jog part is a distance from the second-one feature.

11. The method of fabricating an integrated circuit according to claim 9, wherein the first jog part overlaps the second-one feature.

12. The method of fabricating an integrated circuit according to claim 1,
wherein the substrate comprises a first active area and a second active area parallel to the first active area;
wherein the first pattern and the second pattern pass through the first active area and the second active area.

13. The method of fabricating an integrated circuit according to claim 1, wherein the first feature and the first jog part constitute an L-shape.

14. The method of fabricating an integrated circuit according to claim 1, wherein the first feature and the first jog part constitute a T-shape.

15. The method of fabricating an integrated circuit according to claim 1, wherein the first jog part comprises a plurality of jogs.

\* \* \* \* \*